(12) United States Patent
Choe et al.

(10) Patent No.: US 8,289,314 B2
(45) Date of Patent: Oct. 16, 2012

(54) METHOD OF MODULATING/DEMODULATING A SIGNAL, APPARATUS FOR PERFORMING THE METHOD AND DISPLAY APPARATUS HAVING THE APPARATUS

(75) Inventors: Weon-Jun Choe, Seoul (KR); Ah-Reum Kim, Seoul (KR); Kyo-Jin Choo, Seoul (KR); Deog-Kyoon Jeong, Seoul (KR); Do-Hwan Oh, Seoul (KR); Hee-Soo Song, Wonju-si (KR)

(73) Assignees: Samsung Electronics Co., Ltd. (KR); Seoul National University R&DB Foundation (KR)

( * ) Notice: Subject to any disclaimer, the term of this patent is extended or adjusted under 35 U.S.C. 154(b) by 592 days.

(21) Appl. No.: 12/569,186

(22) Filed: Sep. 29, 2009

(65) Prior Publication Data

US 2010/0238157 A1    Sep. 23, 2010

(51) Int. Cl.
*G06F 3/038* (2006.01)
*G11B 7/00* (2006.01)

(52) U.S. Cl. .................. 345/214; 369/59.23; 369/59.19; 369/47.19

(58) Field of Classification Search .................. None
See application file for complete search history.

(56) References Cited

U.S. PATENT DOCUMENTS

| 5,963,107 A * | 10/1999 | Nagano et al. ............... 332/109 |
| 6,621,878 B2 * | 9/2003 | Dress et al. .................. 375/316 |
| 2007/0018916 A1 * | 1/2007 | Kim et al. ...................... 345/76 |

FOREIGN PATENT DOCUMENTS

| KR | 2000-0002891 | 2/2000 |
| KR | 10-2006-0012679 | 2/2006 |
| KR | 10-2007-0019127 | 2/2007 |
| KR | 10-2008-0051662 | 6/2008 |

* cited by examiner

*Primary Examiner* — Muhammad N Edun
(74) *Attorney, Agent, or Firm* — Cantor Colburn LLP

(57) ABSTRACT

A method of modulating and demodulating a signal includes modulating data information included in an input data signal provided from an external source and clock information included in an input clock signal provided from the external source into a transmission signal, using (n+1) delay clock signals generated based on the input clock signal, where n is a natural number. The transmission signal is demodulated into an output clock signal including restored clock information and an output data signal including restored data information, using (m+1) delay clock signals generated based on the clock information, where m is a natural number less than n.

20 Claims, 6 Drawing Sheets

METHOD OF MODULATING/DEMODULATING A SIGNAL, APPARATUS FOR PERFORMING THE METHOD AND DISPLAY APPARATUS HAVING THE APPARATUS

This application claims priority to Korean Patent Application No. 2009-23855, filed on Mar. 20, 2009, and all the benefits accruing therefrom under 35 U.S.C. §119, the content of which in its entirety is herein incorporated by reference.

BACKGROUND OF THE INVENTION (1) Field of the Invention

Exemplary embodiments of the present invention relate to a method of modulating/demodulating a signal, an apparatus for performing the method, and a display apparatus having the apparatus. Particularly, Exemplary embodiments relate to a method of modulating/demodulating a signal, which may substantially improve display quality and substantially reduce manufacturing costs, an apparatus for performing the method, and a display apparatus having the apparatus.

(2) Description of the Related Art

Generally, a liquid crystal display ("LCD") apparatus includes a display panel which displays an image based on light transmittance of a liquid crystal layer, which is controlled to display the image. The display panel typically includes a backlight unit ("BLU") providing light to the display panel and circuits driving the display panel and the BLU.

Each of the circuits includes a gate driving circuit, a data driving circuit, a timing control circuit and other circuits. The display panel includes an array substrate, an opposite substrate facing the array substrate and the liquid crystal layer disposed between the array substrate and the opposite substrate. The array substrate typically includes a thin-film transistor ("TFT"). In addition, the array substrate includes a plurality of data lines, a plurality of gate lines and a plurality of pixel electrodes. The display panel includes an active area and a peripheral area. The active area is an image displaying area, and the peripheral area surrounds the active area. The gate driving circuit, the data driving circuit and other similar circuits may be disposed in the peripheral area.

The gate driving circuit and the data driving circuit receive control signals from a timing controller disposed on a printed circuit board ("PCB") and drive the display panel. In a conventional display panel, a large number of channels are may be connected between the timing controller and the gate driving circuit and the data driving circuit for communication to drive the display panel.

However, skew is generated between clock information and data information included in the control signals and the display quality is therefore substantially deteriorated.

In addition, since the circuits generally occupy a large portion of the peripheral area for the communication, manufacturing costs of the display apparatus may be increased.

BRIEF SUMMARY OF THE INVENTION

Exemplary embodiments of the present invention provide a method of modulating and demodulating a signal, which substantially improves display quality and substantially reduces the manufacturing costs of a display apparatus.

Exemplary embodiments of the present invention also provide a signal modulation/demodulation apparatus for performing the above-mentioned method.

Exemplary embodiments of the present invention further also provide a display apparatus having the above-mentioned apparatus.

In an exemplary embodiment, a method of modulating/demodulating a signal includes modulating data information included in an input data signal provided from an external source and clock information included in an input clock signal provided from the external source into a transmission signal, using (n+1) delay clock signals generated based on the input clock signal, where n is a natural number, and demodulating the transmission signal into an output clock signal including restored clock information and an output data signal including restored data information, using (m+1) delay clock signals generated based on the clock information, where m is a natural number less than n.

In an exemplary embodiment, (m+1) may be half of (n+1).

In an exemplary embodiment, the modulating the data information and the clock information into the transmission signal may include receiving the input clock signal, generating the (n+1) delay clock signals, a phase of the (n+1) delay clock signals shifted from a phase of the input clock signal, receiving the input data signal, selecting one of the (n+1) delay clock signals, outputting the one of the (n+1) delay clock signals and generating the transmission signal based on the one of the (n+1) delay clock signals and the input clock signal.

In an exemplary embodiment, the transmission signal may transition from a low level to a high level in response to a rising edge of the input clock signal.

In an exemplary embodiment, the transmission signal may transition from a high level to a low level in response to a rising edge of the one of the (n+1) delay clock signals.

In an exemplary embodiment, the demodulating the transmission signal may include receiving the transmission signal, generating the output clock signal and the (m+1) delay clock signals, a phase of the (m+1) delay clock signals shifted from a phase of the output clock signal, from the transmission signal, selecting one of the (m+1) delay clock signals, and outputting the one of the (m+1) delay clock signals and generating the output data signal based on the one of the (m+1) delay clock signals and the output clock signal.

In an exemplary embodiment, the output data signal may be generated based on the one of the (m+1) delay clock signals in response to a falling edge of the transmission signal.

In an exemplary embodiment of the present invention, an apparatus for modulating/demodulating a signal includes a signal modulation part and a signal demodulation part. The signal modulation part modulates data information included in an input data signal provided from an external source and clock information included in an input clock signal provided from the external source into a transmission signal, using n delay clock signals generated based on the input clock signal, where n is a natural number. The signal demodulation part demodulates the transmission signal into an output clock signal including restored clock information and an output data signal including restored data information, using (m+1) delay clock signals generated based on the clock information, where m is a natural number less than n.

In an exemplary embodiment, the signal modulation part may include a modulation delay part which receives the input clock signal and generates the (n+1) delay clock signals, a phase of the (n+1) delay clock signals shifted from a phase of the input clock signal, a modulation selection part which receives the input data signal, selects one of the (n+1) delay clock signals and outputs the one of the (n+1) delay clock signals, and a transmission signal generation part which generates the transmission signal based on the one of the (n+1) delay clock signals and the input clock signal.

In an exemplary embodiment, the transmission signal transitions from a low level to a high level in response to a rising edge of the input clock signal.

In an exemplary embodiment, the transmission signal transitions from a high level to a low level in response to a rising edge of the one of the (n+1) delay clock signals.

In an exemplary embodiment, the transmission signal may transition from the high level to the low level at a point of time in a period of the transmission signal, the point of time equal to one of $3/14$, $5/14$, $7/14$, $9/14$ and $11/14$ of the period.

In an exemplary embodiment, the signal demodulation part may include a demodulation delay part which receives the transmission signal and generates the output clock signal and the (m+1) delay clock signals, a phase of the (m+1) delay clock signals shifted in phase from a phase of the output clock signal, from the transmission signal, a demodulation selection part which receives the transmission signal, selects one of the (m+1) delay clock signals, and outputs the one of the (m+1) delay clock signals, and a restoring part which generates the output data signal including the restored data information based on the one of the (m+1) delay clock signals and the output clock signal.

In an exemplary embodiment, the output data signal may be generated based on the one of the (m+1) delay clock signals in response to a falling edge of the transmission signal.

In an exemplary embodiment of the present invention, a display apparatus includes a display panel, a timing controller, a signal modulation/demodulation apparatus and a panel driving part. The display panel displays an image. The timing controller generates an input clock signal including clock information and an input data signal including data information. The signal modulation/demodulation apparatus includes a signal modulation part and a signal demodulation part. The signal modulation part modulates the data information included in the input data signal and the clock information included in the input clock signal into a transmission signal, using (n+1) delay clock signals generated based on the input clock signal, where n is a natural number. The signal demodulation part demodulates the transmission signal into an output clock signal including restored clock information and an output data signal including restored data information, using (m+1) delay clock signals generated based on the clock information, where m is a natural number less than n. The panel driving part drives the display panel by receiving the output clock signal and the output data signal from the signal modulation/demodulation apparatus.

In an exemplary embodiment, the signal modulation part includes: a modulation delay part which receives the input clock signal and generates (n+1) delay clock signals, a phase of the (n+1) delay clock signals shifted from a phase of the input clock signal; a modulation selection part which receives the input data signal, selects one of the (n+1) delay clock signals, and outputs the one of the (n+1) delay clock signal; and a transmission signal generation part which generates the transmission signal based on the one of the (n+1) delay clock signals and the input clock signal.

In an exemplary embodiment, the transmission signal generation part includes a latch. In an exemplary embodiment, the delay clock signal resets the latch.

In an exemplary embodiment, a single channel may be disposed between the signal modulation part and the signal demodulation part.

In an exemplary embodiment, a circuit area of the signal modulation part may be less than that of the signal demodulation part.

According to exemplary embodiments of the present invention, transmitting a transmission signal including clock information and data information from a signal modulation part to a signal demodulation part, substantially improves the display quality of a display apparatus. In addition, manufacturing costs of the display apparatus are substantially decreased by adjusting the number of delay clock signals of the signal modulation part lower than the number of delay clock signals of the signal demodulation part.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION OF THE INVENTION

Figure 1:
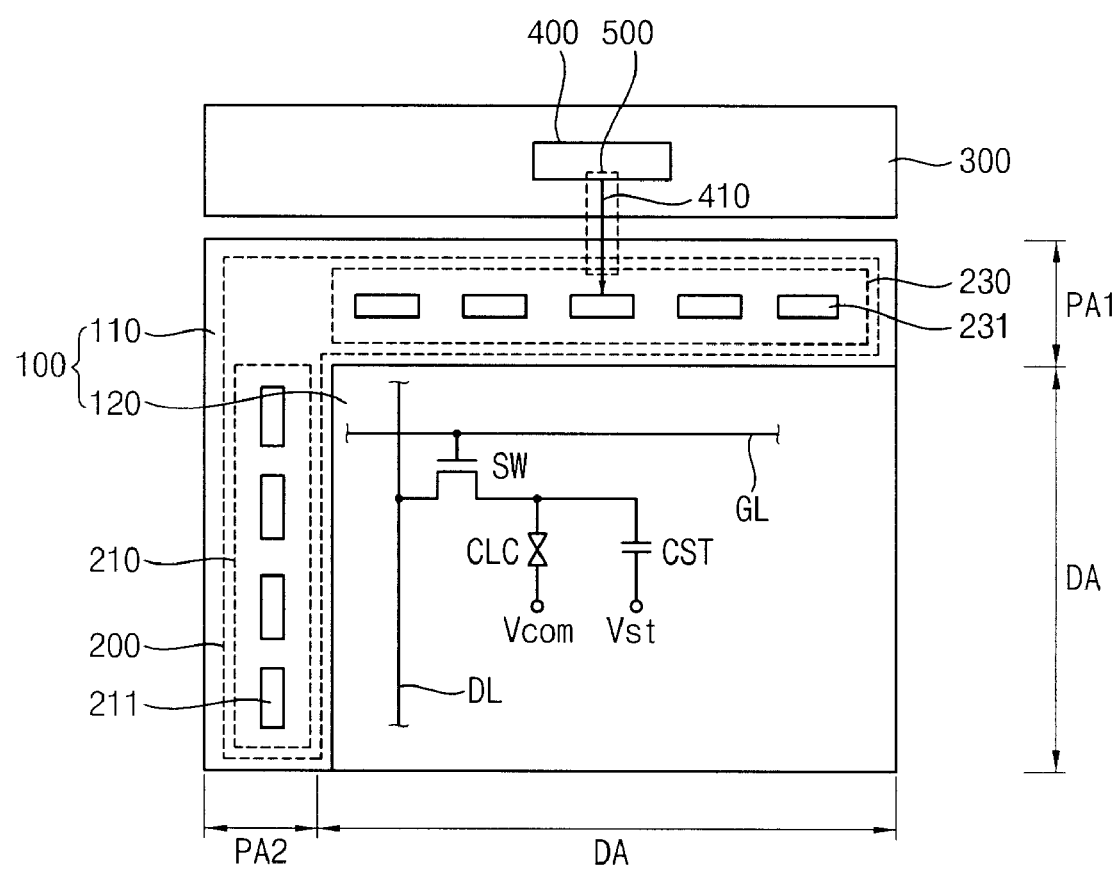
FIG. 1 is a plan view of an exemplary embodiment of a display apparatus according to the present invention.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of the present invention will be described in further detail with reference to the accompanying drawings.

FIG. 1 is a plan view of an exemplary embodiment of a display apparatus according to the present invention.

In an exemplary embodiment of FIG. 1, a display apparatus includes a display panel 100, a panel driving part 200 which drives the display panel 100, a printed circuit board ("PCB") 300, a timing control part 400 disposed on the PCB 300 to control the panel driving part 200, and a signal modulation/demodulation part 500 which performs communication between the timing control part 400 and the panel driving part 200.

The display panel 100 includes an array substrate 110, an opposite substrate 120, e.g., a color filter substrate 120 combined with the array substrate 110, and a liquid crystal layer (not shown) interposed between the array substrate 110 and the opposite substrate 120. In an exemplary embodiment, the display panel 100 includes a display area DA, a first peripheral area PA1 and a second peripheral area PA2. The first peripheral area PA1 and the second peripheral area PA2 surround at least a portion of the display area DA.

A plurality of pixel parts electrically connected to gate lines GL and data lines DL are disposed in the display area DA. In each one of the plurality of pixel parts, a switching element SW a liquid crystal capacitor CLC and a storage capacitor CST are disposed. The switching element SW includes a thin-film transistor ("TFT"). The liquid crystal capacitor CLC and a storage capacitor CST are electrically connected to the switching element SW.

In an exemplary embodiment, a gate electrode and a source electrode of the switching element SW may be electrically connected to the gate line GL and the data line DL, respectively, and a drain electrode of the switching element SW is electrically connected to the liquid crystal capacitor CLC and the storage capacitor CST.

An end portion of the data lines DL may be positioned at the first peripheral area PA1, and an end portion of the gate lines GL may be positioned at the second peripheral area PA2.

The panel driving part 200 includes a gate driving part 210 and a data driving part 230.

In one exemplary embodiment, the gate driving part 210 is disposed in the second peripheral area PA2 to output a gate signal to the gate lines GL. In an exemplary embodiment, the gate driving part 210 may include at least one gate driving chip 211, and the gate driving chip 211 receives a gate control signal from the timing control part 400 to drive the display panel 100. Alternative exemplary embodiments include configurations wherein the gate driving chip 211 may be disposed on a tape carrier package ("TCP") disposed between the PCB 300 and the display panel 100.

The gate driving part 210 may include a shift register including cascaded stages, and may sequentially output the gate signal to the gate lines GL. Alternative exemplary embodiments include configurations wherein the gate driving part 210 may be formed as an integrated circuit, and integrated in the second peripheral area PA2. Accordingly, an additional space for mounting the gate driving part 210 is thereby not required, so that a slim-type display apparatus is manufactured.

The data driving part 230 outputs an analog data signal to the data lines DL in synchronization with the gate signal. The data driving part 230 may include at least one data driving chip 231.

The data driving chip 231 may be attached in the first peripheral area PA1 of the display panel 100 as a chip-on-glass ("COG") type. The timing control part 400 provides a data control signal to the data driving chips 231 through a signal wiring 410. In an exemplary embodiment, the data driving chips 231 may share the signal wiring 410 in a cascade configuration.

In an exemplary embodiment, the data driving chips 231 may share the signal wiring 410 extended from a flexible film (not shown).

The signal wiring 410 may be also extended to the gate driving chip 211.

The signal modulation/demodulation part 500 transmits the gate control signal and the data control signal from the timing control part 400 to the gate driving part 210 and the data driving part 230.

In one alternative exemplary embodiment, the data driving part 230 may be integrated in the first peripheral area PA1 as an integrated circuit.

Figure 2:
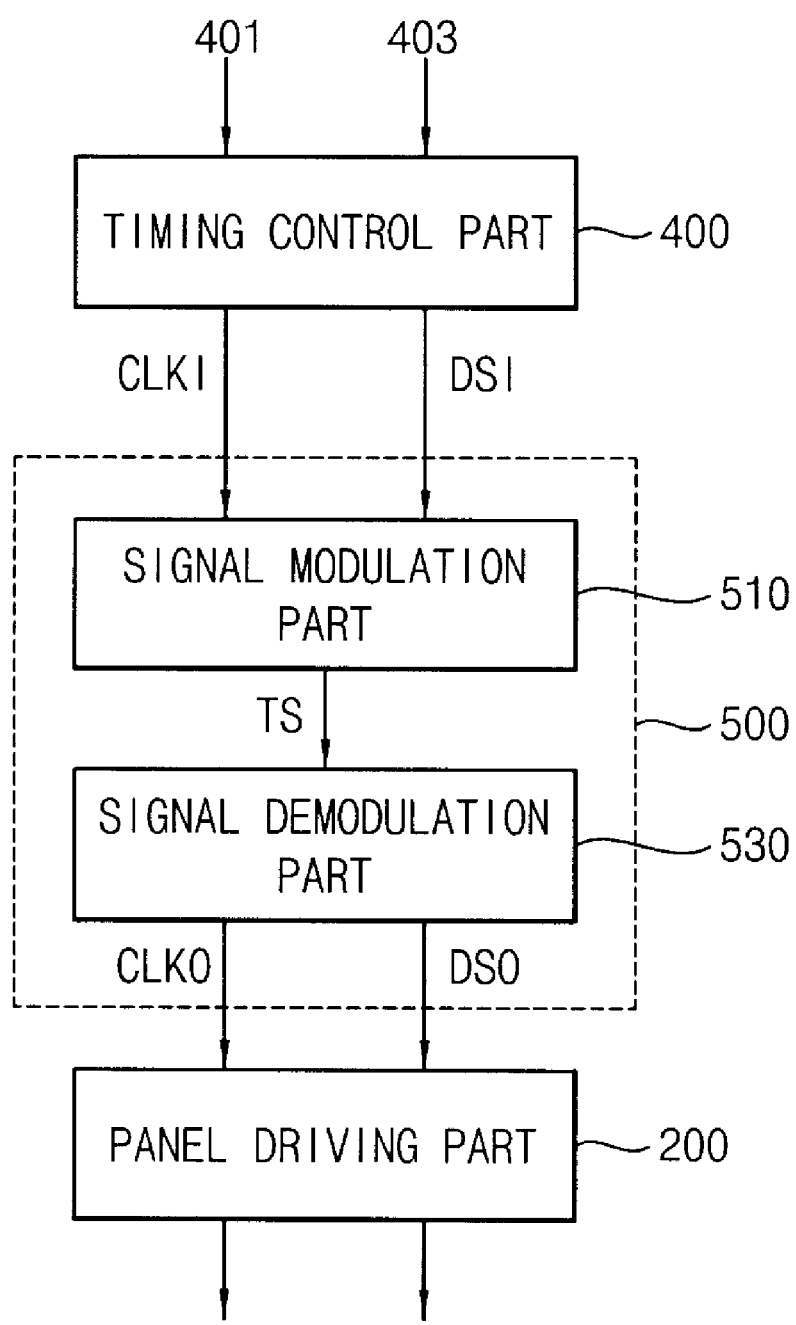
FIG. 2 is a block diagram illustrating an exemplary embodiment of a timing control part, a signal modulation/demodulation part and a panel driving part of the display apparatus shown in FIG. 1.

FIG. 2 is a block diagram illustrating an exemplary embodiment of a timing control part 400, a signal modulation part, a signal demodulation part 500 and a panel driving part 200 of the display apparatus shown in FIG. 1.

In an exemplary embodiment, as shown in FIGS. 1 and 2, the timing control part 400 receives a synchronization signal 401 and data 403 from an external source. The synchronization signal 401 includes a horizontal synchronization signal, a vertical synchronization signal and a data enable signal in synchronization with the horizontal synchronization signal. The vertical synchronization signal represents a time required for displaying one frame. The horizontal synchronization signal represents a time required for displaying one line of the frame. Thus, the horizontal synchronization signal includes pulses corresponding to the number of pixels included in one line. The data enable signal represents a time required for supplying the pixel with data. The data 403 includes red data, green data and blue data.

The timing control part 400 generates the gate control signal, which is in an exemplary embodiment an input clock signal CKLI, and the data control signal, which is in an exemplary embodiment an input data signal DSI, for controlling the driving time of the panel driving part 200 using the synchronization signal 401 and the data 403.

The signal modulation/demodulation part 500 includes a signal modulation part 510 and a signal demodulation part 530.

The signal modulation part 510 may be disposed adjacent to the timing control part 400. The signal modulation part 510 transmits the gate control signal and the data control signal generated at the timing control part 400 to the signal demodulation part 530. In an exemplary embodiment, the gate control signal and the data control signal are defined as a transmission signal TS.

The transmission signal TS includes clock information and data information. In an exemplary embodiment, a rising edge of the transmission signal TS may be fixed based on the clock information, and a falling edge of the transmission signal TS may be varied based on the data information.

Therefore, when the panel driving part 200 receives the transmission signal TS, the clock information may be easily obtained from the periodic generation of the rising edge. In addition, since the data information may be loaded on the transmission signal TS along with the clock information, the transmission signal TS may be transmitted using a single channel.

The signal demodulation part 530 may be disposed adjacent to the panel driving part 200. The signal demodulation part 530 receives the transmission signal TS from the signal modulation part 510 and provides the transmission signal TS to the panel driving part 200. In an exemplary embodiment, a circuit area of the signal demodulation part 530 may be larger than a circuit area of the signal modulation part 510.

The signal demodulation part 530 may provide the clock information and the data information included in the transmission signal TS, so that the panel driving part 200 may use the clock and data information.

The panel driving part 200 may include the gate driving part 210 and the data driving part 230 in FIG. 1 so that the panel driving part 200 drives the display panel 100 using the clock information and the data information provided from the signal demodulation part 530.

Figure 3:
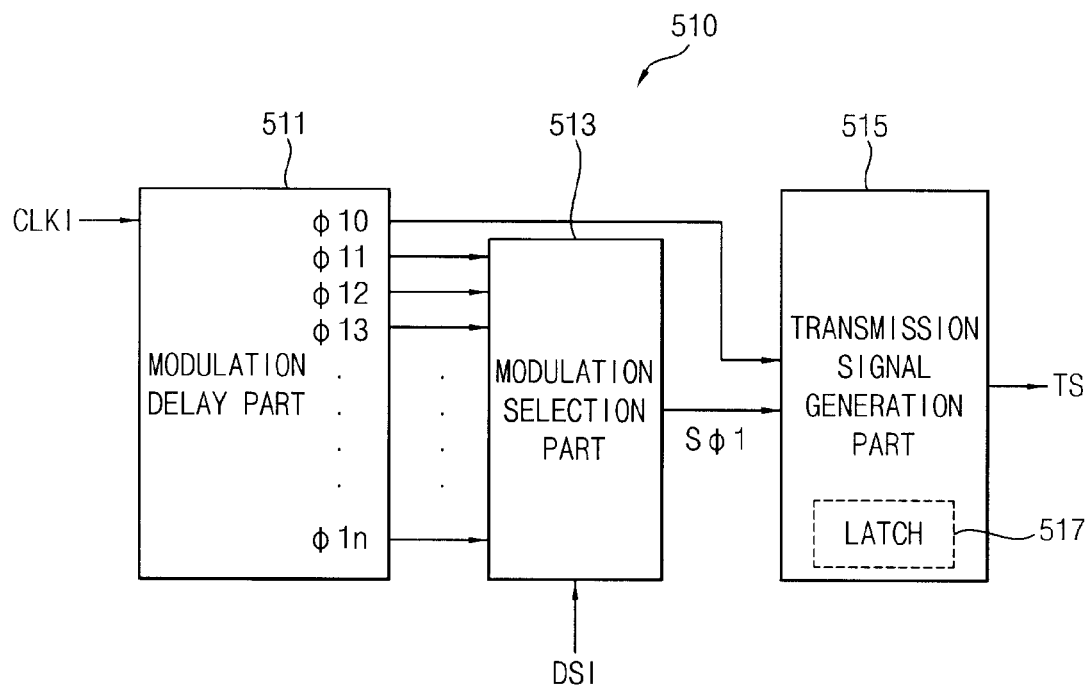
FIG. 3 is a block diagram illustrating an exemplary embodiment of the signal modulation part in FIG. 2.

FIG. 3 is a block diagram illustrating an exemplary embodiment of the signal modulation part 510 of FIG. 2.

In an exemplary embodiment, as shown in FIGS. 2 and 3, the signal modulation part 510 includes a modulation delay part 511, a modulation selection part 513 and a transmission signal generation part 515.

The modulation delay part 511 receives the input clock signal CLKI including the clock information from an external source. The modulation delay part 511 outputs a first delay clock signal $\Phi 10$ which is substantially the same as the input clock signal CLKI. The modulation delay part 511 also outputs signals including a second delay clock signal $\Phi 11$ through an (n+1)-th delay clock signal $\Phi 1n$ which are signals shifted in phase from the input clock signal CLKI, in response to the input clock signal CLKI, where n is a natural number.

The modulation selection part 513 receives the input data signal DSI including the data information from an external source. The modulation selection part 513 provides one of the second delay clock signal $\Phi 11$ through the (n+1)-th delay clock signal $\Phi 1n$ as a first selection signal $S\Phi 1$ to the transmission signal generation part 515, in response to the input data signal DSI.

The transmission signal generation part 515 may include a latch 517. In one exemplary embodiment, the transmission signal generation part 515 generates the transmission signal TS, which may transition to a high level by the rising edge of the first delay clock signal $\Phi 10$.

The transmission signal generation part 515 transitions the transmission signal TS of the high level to a low level in response to the first selection signal $S\Phi 1$ and outputs the transmission signal TS of the low level.

In an exemplary embodiment, the transmission signal generation part 515 latches a rising edge of the first selection signal $S\Phi 1$. The rising edge of the first selection signal $S\Phi 1$ resets the latch 517 included in the transmission signal generation part 515. Accordingly, when the first selection signal $S\Phi 1$ is the rising edge, the transmission signal generation part 515 transitions the transmission signal TS from the high level to the low level and outputs the transmission signal TS including the low level.

Thus, the rising edge of the transmission signal TS is generated by the first delay clock signal $\Phi 10$, which is substantially the same signal as the input clock signal CLKI and the falling edge of the transmission signal TS may be generated by the first selection signal $S\Phi 1$.

The input clock signal CLKI includes the clock information, and the first selection signal $S\Phi 1$ includes the data information because the first selection signal $S\Phi 1$ is a signal generated by the input data signal DSI.

Thus, the transmission signal TS including the clock information and the data information may be transmitted to the signal demodulation part 530 using a single channel. Therefore, the generation of skew between the clock information and the data information is effectively prevented or substantially reduced, so that the display quality of the display apparatus is enhanced.

Figure 4:
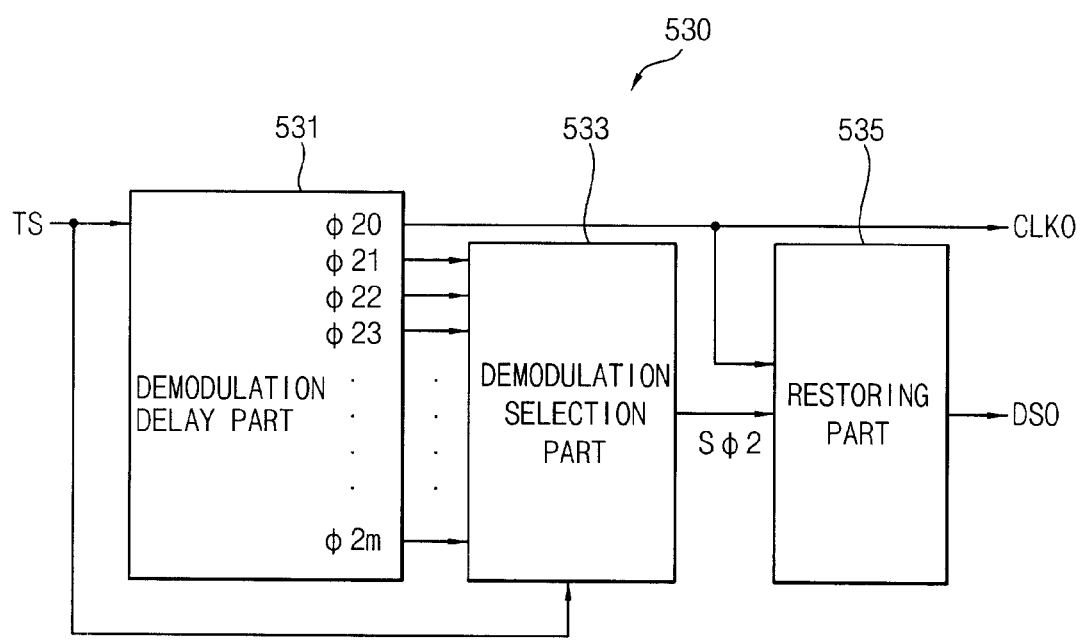
FIG. 4 is a block diagram illustrating an exemplary embodiment of the signal demodulation part in FIG. 2.

FIG. 4 is a block diagram illustrating an exemplary embodiment of the signal demodulation part 530 of FIG. 2.

The signal demodulation part 530 according to an exemplary embodiment includes a demodulation delay part 531, a demodulation selection part 533, and a restoring part 535.

The demodulation delay part 531 receives the transmission signal TS from the signal modulation part 510. The demodulation delay part 531 outputs an output clock signal CLKO based on the transmission signal TS as a first delay clock signal Φ20. In addition, the demodulation delay part 531 outputs signals including a second delay clock signal Φ21 through an (m+1)-th delay clock signal Φ2m, which are signals shifted in phase from the output clock signal CLKO, in response to the transmission signal TS, where m is a natural number. In an exemplary embodiment, (m+1) may be half of (n+1).

The demodulation selection part 533 may select one of the second delay clock signal Φ21 through the (m+1)-th delay clock signal Φ2m and provide the selected signal as the second selection signal SΦ2 to the restoring part 535, in response to the transmission signal TS.

The restoring part 535 may obtain the data information included in the transmission signal TS based on the second selection signal SΦ2. Thus, obtained data information may be outputted as an output data signal DSO.

Figure 5:
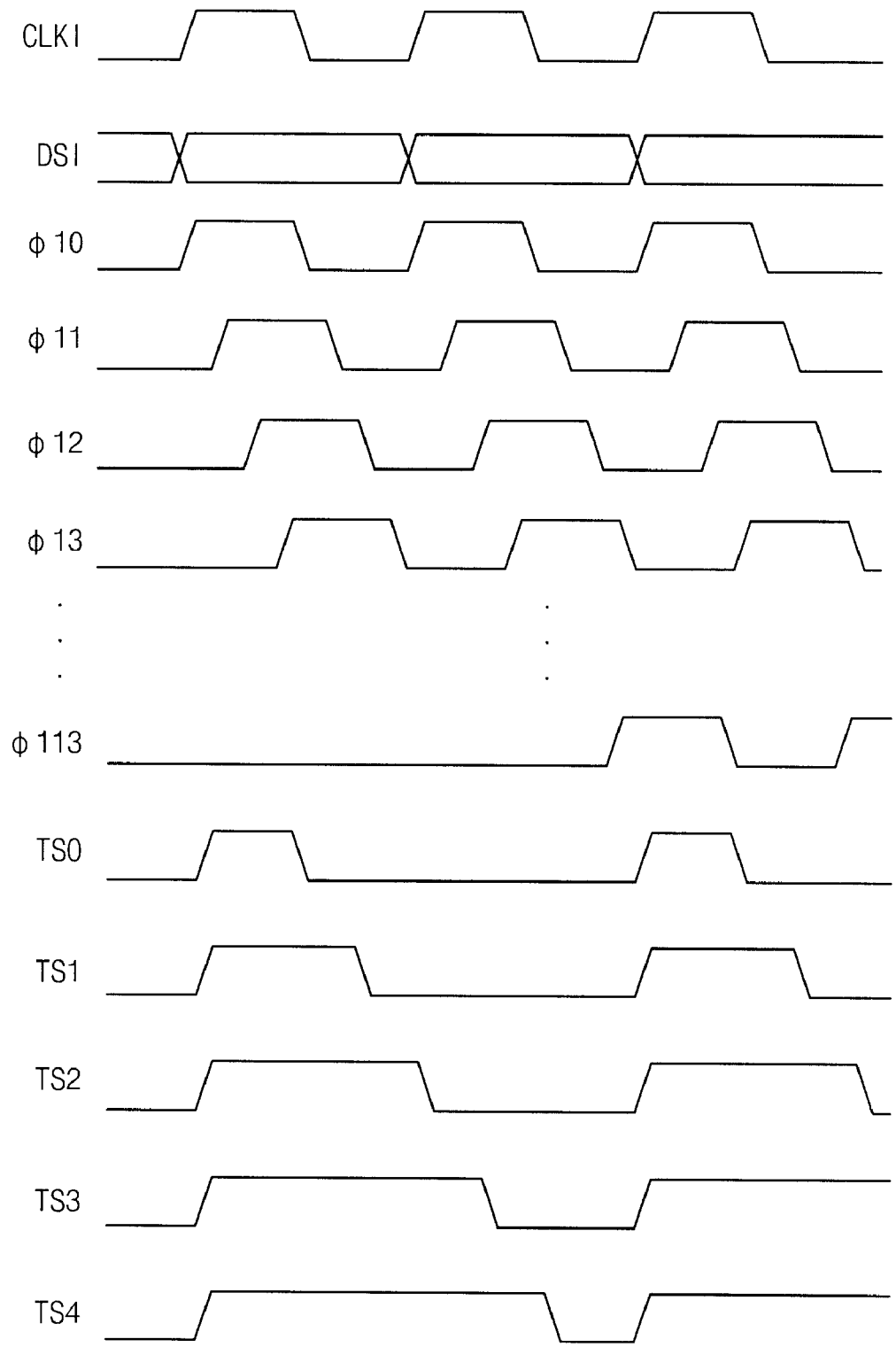
FIG. 5 is a signal timing diagram illustrating waveforms of input/output signals of the signal modulation part in FIG. 3.

FIG. 5 is a signal timing diagram illustrating waveforms of input/output signals of the signal modulation part 510 of FIG. 3.

In an exemplary embodiment of FIGS. 3 and 5, the output signals of the modulation delay part 511 are signals from the first delay clock signal Φ10 to the (n+1)-th delay clock signal Φ1n. An exemplary embodiment of input/output signals of the signal modulation part when n is 13 will now be described in further detail. In an exemplary embodiment, the transmission signal TS may include the data information of 2 bits per duty.

The first delay clock signal Φ10 is substantially the same as the input clock signal CLKI. The signals including the second delay clock signal Φ11 through the (n+1)-th delay clock signal Φ1n are signals shifted in phase from the input clock signal CLKI.

As illustrated in FIG. 5, the second delay clock signal Φ11 is a phase-delayed signal delayed by a first delay amount from the first delay clock signal Φ10, and the third delay clock signal Φ12 is a phase-delayed signal delayed by two times the first delay amount from the first delay clock signal Φ10. The fourth delay clock signal Φ13 is a phase-delayed signal delayed by three times the first delay amount from the first delay clock signal Φ10.

In an exemplary embodiment, the (n+1)-th delay clock signal Φ1n is a phase-delayed signal delayed by n times the first delay amount from the first delay clock signal Φ10. In an exemplary embodiment, since 'n' is 13, the fourteenth delay clock signal Φ113 is a phase-delayed signal delayed by thirteen times the first delay amount from the first delay clock signal Φ10. The phase-delayed signal delayed by the first delay amount from the fourteenth delay clock signal Φ113 may be the input clock signal CLKI.

The output signal from the transmission signal generation part 515 is the transmission signal TS. The transmission signal TS is a generated signal based on the first delay clock signal Φ10 and the first selection signal SΦ1, which is one of the second delay clock signal Φ11 through the fourteenth delay clock signal Φ113.

As illustrated in FIG. 5, when the first delay clock signal Φ10 is provided to the transmission signal generation part 515 and the fourth delay clock signal Φ13 is provided as the first selection signal SΦ1, the transmission signal generation part 515 may output a first transmission signal TS0. The first transmission signal TS0 may represent value of "00".

When the first delay clock signal Φ10 is provided to the transmission signal generation part 515 and the sixth delay clock signal Φ15 is provided as the first selection signal SΦ1, the transmission signal generation part 515 may output a second transmission signal TS1. The second transmission signal TS1 may represent value of "01".

When the first delay clock signal Φ10 is provided to the transmission signal generation part 515 and the eighth delay clock signal Φ17 is provided as the first selection signal SΦ1, the transmission signal generation part 515 may output a third transmission signal TS2. The third transmission signal TS2 may represent a special character bit. The special character bit may be a bit which determines whether the transmission signal is a data signal, a signal protocol signal or a panel control signal.

When the first delay clock signal Φ10 is provided to the transmission signal generation part 515 and the tenth delay clock signal Φ19 is provided as the first selection signal SΦ1, the transmission signal generation part 515 may output a fourth transmission signal TS3. The fourth transmission signal TS3 may represent value of "10".

When the first delay clock signal Φ10 is provided to the transmission signal generation part 515 and the twelfth delay clock signal Φ111 is provided as the first selection signal SΦ1, the transmission signal generation part 515 may output a fifth transmission signal TS4. The fifth transmission signal TS4 may represent value of "11".

In an alternative exemplary embodiment, the transmission signal TS may transition from a high level to a low level at a point of time in a period of the transmission signal, the point of time equal to one of $3/14$, $5/14$, $7/14$, $9/14$ and $11/14$ of the period.

Figure 6:
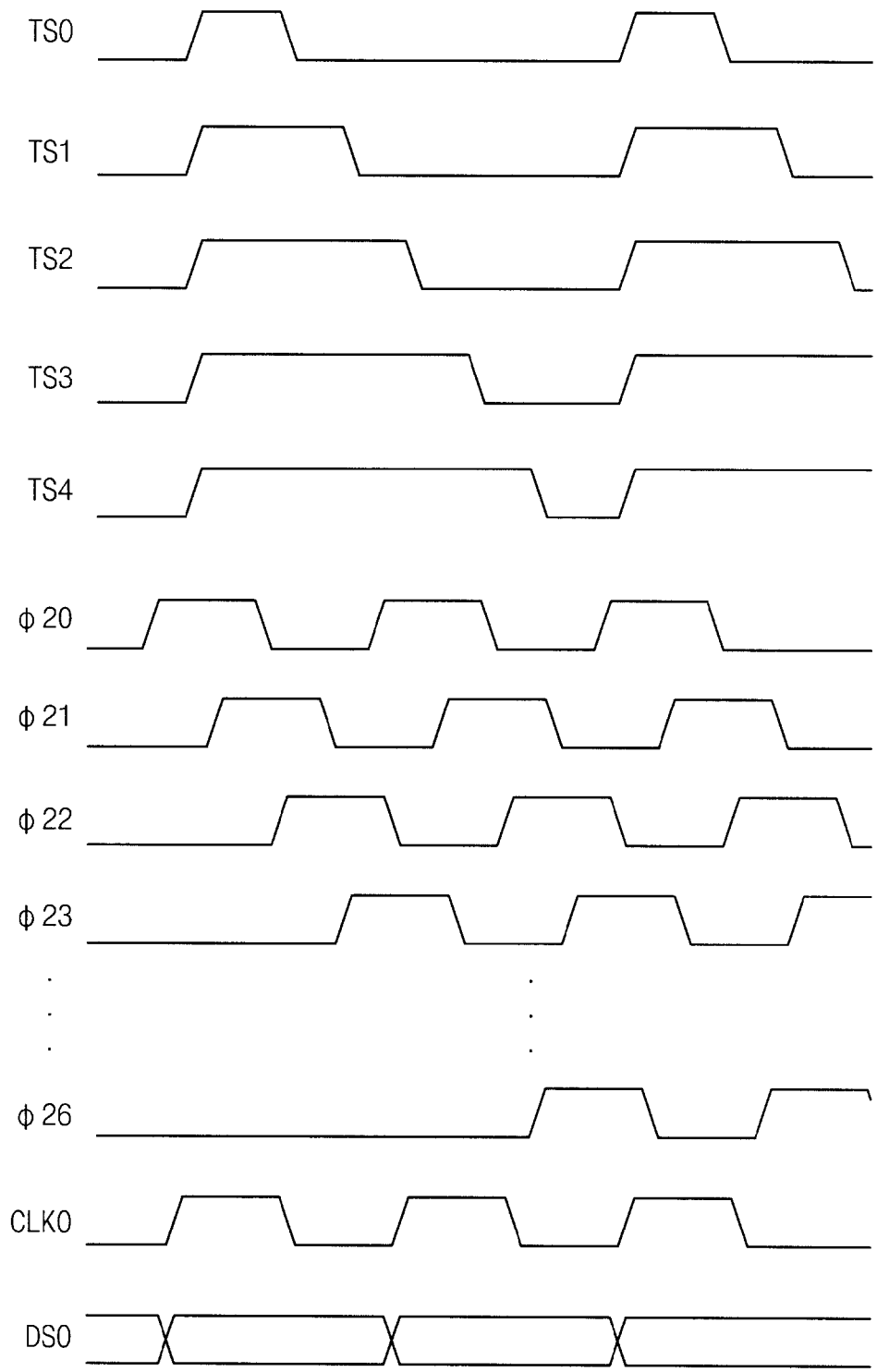
FIG. 6 is a signal timing diagram illustrating waveforms of input/output signals of the signal demodulation part in FIG. 4.

FIG. 6 is a signal timing diagram illustrating waveforms of input/output signals of the signal demodulation part 530 in FIG. 4.

In an exemplary embodiment of FIGS. 4 and 6, the output signals from the demodulation delay part 531 are from a first delay clock signal Φ20 to an (m+1)-th delay clock signal Φ2m. An exemplary embodiment of input/output signals of the signal demodulation part when 'm' is 6 will be now described in further detail.

The demodulation delay part 531 outputs the output clock signal CLKO based on the transmission signal TS as the first delay clock signal Φ20. In addition, the demodulation delay part 531 outputs signals from a second delay clock signal Φ21 to a seventh clock signal Φ26, which are signals shifted in phase from the output clock signal CLKO.

As illustrated in FIG. 6, the second delay clock signal Φ21 is a phase-delayed signal delayed by a second delay amount from the first delay clock signal Φ20. The third delay clock signal Φ22 is a phase-delayed signal delayed by two times the second delay amount from the first delay clock signal Φ20 and the fourth delay clock signal Φ23 is a phase-delayed signal delayed by three times the second delay amount from the first delay clock signal Φ20.

That is, the (m+1)-th delay clock signal Φ2m is a phase-delayed signal delayed by m times the second delay amount from the first delay clock signal Φ20. In an exemplary embodiment, since 'm' is 6, the seventh delay clock signal Φ26 is a phase-delayed signal delayed by six times the second delay amount from the first delay clock signal Φ20. The phase-delayed signal delayed from the seventh delay clock signal Φ26 by the second delay amount may be the first delay clock signal Φ20.

The output signal from the restoring part 535 is an output data signal DSO including the data information. The output data signal DSO is a generated signal based on a second selection signal SΦ2, which is one of the second delay clock signal Φ21 through the seventh delay clock signal Φ26.

As illustrated in FIG. 6, when the second delay clock signal Φ21 is applied to the restoring part 535, the restoring part 535 may output the output data signal DSO representing value of "00".

When the third delay clock signal Φ22 is applied to the restoring part 535 as the second selection signal SΦ2, the restoring part 535 may output the output data signal DSO representing value of "01".

When the fourth delay clock signal Φ23 is applied to the restoring part 535 as the second selection signal SΦ2, the restoring part 535 may output a special character signal representing a special character bit.

When the fifth delay clock signal Φ24 is applied to the restoring part 535 as the second selection signal SΦ2, the restoring part 535 may output the output data signal DSO representing value of "10".

When the sixth delay clock signal Φ25 is applied to the restoring part 535 as the second selection signal SΦ2, the restoring part 535 may output the output data signal DSO representing value of "11".

Figure 7:
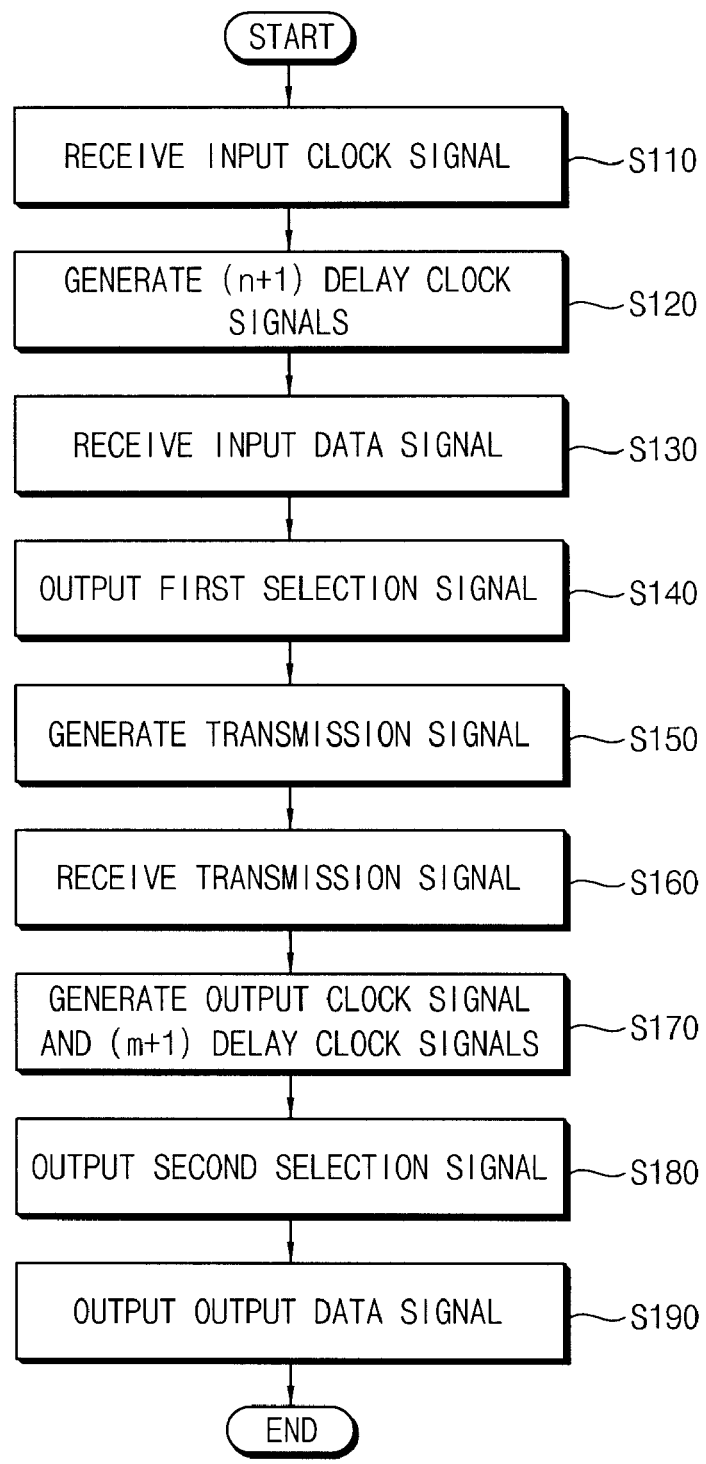
FIG. 7 is a flowchart illustrating an exemplary embodiment of a method of modulating/demodulating a signal of the signal modulation/demodulation part in FIG. 2.

FIG. 7 is a flowchart illustrating an exemplary embodiment of a method of modulating/demodulating a signal of the signal modulation/demodulation part of FIG. 2.

In an exemplary embodiment of FIGS. 2 and 7, the modulation delay part 511 receives the input clock signal CLKI from the timing control part 400 (step S110).

The modulation delay part 511 generates (n+1) delay clock signals (from the first delay clock signal Φ10 to the (n+1)-th delay clock signal Φ1n) based on the input clock signal CLKI (step S120).

The modulation selection part 513 receives the input data signal DSI from the timing control part 400 (step S130).

The modulation selection part 513 uses the (n+1) delay clock signals (from the first delay clock signal Φ10 to the (n+1)-th delay clock signal Φ1n) and outputs one signal of the (n+1) delay clock signals (from the first delay clock signal Φ10 to the (n+1)-th delay clock signal Φ1n) as the first selection signal Φ31 in response to the input data signal DSI (step S140).

The transmission signal generation part 515 generates the transmission signal TS including the clock information and the data information using the first delay clock signal Φ20 and the first selection signal SΦ1 (step S150). In this exemplary embodiment, the first delay clock signal Φ10 may be substantially the same as the input clock signal CLKI.

The demodulation delay part 531 receives the transmission signal (step S160).

The demodulation delay part 531 outputs the output clock signal CLKO from the transmission signal TS and generates phase shifted signals, (m+1) delay clock signals (from Φ20 to Φ2m) from the output clock signal CLKO using the output clock signal CLKO (step S170). In this exemplary embodiment, the output clock signal CLKO includes the clock information.

The demodulation selection part 533 selects one of the (m+1) delay clock signals (from Φ20 to Φ2m) in response to the transmission signal TS, and outputs the selected signal as the second selection signal SΦ2 (step S180).

The restoring part 535 outputs the output data signal DSO based on the second selection signal SΦ2 and the output clock signal CLKO (step S190). In this case, the output data signal DSO includes the data information.

The clock information and the data information received from the timing control part 400 are modulated by the signal modulation part 510 to the transmission signal TS and the transmission signal TS is provided to a single channel. After passing the single channel, the transmission signal TS is applied to the signal demodulation part 530. The clock information and the data information restored from the transmission signal TS may be provided to the panel driving part 200.

In an exemplary embodiment, the circuit structure of the signal demodulation part 530 is substantially simplified by designing the signal modulation/demodulation part 500 including half the number of output signals of the demodulation delay part 531 with respect to the number of output signals of the modulation delay part 511. The complicated circuit structure of the signal demodulation part 530 disposed adjacent to the panel driving part 200 is also substantially simplified. Therefore, a manufacturing cost of the display apparatus is substantially reduced.

In exemplary embodiments of the present invention, a transmission signal including clock information and data information is transmitted from a signal modulation part to a signal demodulation part using a single channel. Therefore, the generation of skew between the clock information and the data information is effectively prevented or substantially reduced. Furthermore, the display quality of a display apparatus is improved.

In addition, the number of delay clock signals of the signal modulation part is larger than that of delay clock signals of the signal demodulation part. Therefore, the manufacturing cost of the display apparatus is reduced.

The present invention should not be construed as being limited to the exemplary embodiments set forth herein. Rather, these exemplary embodiments are provided so that this disclosure will be thorough and complete and will fully convey the concept of the present invention to those skilled in the art.

While the present invention has been particularly shown and described with reference to exemplary embodiments thereof, it will be understood by those of ordinary skill in the art that various changes in form and details may be made therein without departing from the spirit or scope of the present invention as defined by the following claims.

What is claimed is:

1. A method of modulating and demodulating a signal, the method comprising:
   modulating data information included in an input data signal provided from an external source and clock information included in an input clock signal provided from the external source into a transmission signal, using (n+1) delay clock signals generated based on the input clock signal; and
   demodulating the transmission signal into an output clock signal including restored clock information and an output data signal including restored data information, using (m+1) delay clock signals generated based on the clock information,
   wherein n is a natural number, and
   m is a natural number less than n.

2. The method of claim 1, wherein (m+1) is half of (n+1).

3. The method of claim 1, wherein the modulating the data information and the clock information into the transmission signal comprises:
   receiving the input clock signal;
   generating the (n+1) delay clock signals, a phase of the (n+1) delay clock signals shifted from a phase of the input clock signal;
   receiving the input data signal;
   selecting one of the (n+1) delay clock signals;
   outputting the one of the (n+1) delay clock signals; and
   generating the transmission signal based on the one of the (n+1) delay clock signals and the input clock signal.

4. The method of claim 3, wherein the transmission signal transitions from a low level to a high level in response to a rising edge of the input clock signal.

5. The method claim 3, wherein the transmission signal transitions from a high level to a low level in response to a rising edge of the one of the (n+1) delay clock signals.

6. The method of claim 1, wherein the demodulating the transmission signal comprises:
   receiving the transmission signal;
   generating the output clock signal and the (m+1) delay clock signals, a phase of the (m+1) delay clock signal shifted from a phase of the output clock signal, from the transmission signal;
   selecting one of the (m+1) delay clock signals;
   outputting the one of the (m+1) delay clock signals; and
   generating the output data signal based on the one of the (m+1) delay clock signals and the output clock signal.

7. The method of claim 6, wherein the generating the output data signal is based on the one of the (m+1) delay clock signals in response to a falling edge of the transmission signal.

8. An apparatus for modulating and demodulating a signal comprising:
   a signal modulation part which modulates data information included in an input data signal provided from an external source and clock information included in an input clock signal provided from the external source into a transmission signal, using (n+1) delay clock signals generated based on the input clock signal; and
   a signal demodulation part which demodulates the transmission signal into an output clock signal including restored clock information and an output data signal including restored data information, using (m+1) delay clock signals generated based on the clock information,
   wherein n is a natural number, and
   m is a natural number less than n.

9. The apparatus of claim 8, wherein the signal modulation part comprises:
   a modulation delay part which receives the input clock signal and generates the (n+1) delay clock signals shifted in phase from the input clock signal;
   a modulation selection part which receives the input data signal, selects one of the (n+1) delay clock signals, and outputs the one of the (n+1) delay clock signals; and
   a transmission signal generation part which generates the transmission signal based on the one of the (n+1) delay clock signals and the input clock signal.

10. The apparatus of claim 9, wherein the transmission signal transitions from a low level to a high level in response to a rising edge of the input clock signal.

11. The apparatus of claim 9, wherein the transmission signal transitions from a high level to a low level in response to a rising edge of the one of the (n+1) delay clock signals.

12. The apparatus of claim 11, wherein the transmission signal transitions from the high level to the low level at a point of time in a period of the transmission signal, the point of time equal to one of $3/14$, $5/14$, $7/14$, $9/14$ and $11/14$ of the period.

13. The apparatus of claim 8, wherein the signal demodulation part comprises:
   a demodulation delay part which receives the transmission signal, and generates the output clock signal and the (m+1) delay clock signals, a phase of the (m+1) delay clock signals shifted from a phase of the output clock signal, from the transmission signal;
   a demodulation selection part which receives the transmission signal, selects one of the (m+1) delay clock signals, and outputs the one of the (m+1) delay clock signals; and
   a restoring part which generates the output data signal including the restored data information based on the one of the (m+1) delay clock signals and the output clock signal.

14. The apparatus of claim 13, wherein the output data signal is generated based on the one of the (m+1) delay clock signals in response to a falling edge of the transmission signal.

15. A display apparatus comprising:
   a display panel which displays an image;
   a timing controller which generates an input clock signal including clock information and an input data signal including data information;
   a signal modulation and demodulation apparatus comprising:
      a signal modulation part which modulates the data information included in the input data signal and the clock information included in the input clock signal into a transmission signal, using (n+1) delay clock signals generated based on the input clock signal; and
      a signal demodulation part which demodulates the transmission signal into an output clock signal including restored clock information and an output data signal including restored data information, using (m+1) delay clock signals generated based on the clock information; and
   a panel driving part which drives the display panel by receiving the output clock signal and the output data signal from the signal modulation and demodulation apparatus,
   wherein n is a natural number, and
   m is a natural number less than n.

16. The display apparatus of claim 15, wherein the signal modulation part comprises:
   a modulation delay part which receives the input clock signal, and generates the (n+1) delay clock signals shifted in phase from the input clock signal;
   a modulation selection part which receives the input data signal, selects one of the (n+1) delay clock signals, and outputs the one of the (n+1) delay clock signals; and
   a transmission signal generation part which generates the transmission signal based on the one of the (n+1) delay clock signals and the input clock signal.

17. The display apparatus of claim 16, wherein the transmission signal generation part includes a latch.

18. The display apparatus of claim 17, wherein the one of the (n+1) delay clock signal resets the latch.

19. The display apparatus of claim 15, wherein a single channel is disposed between the signal modulation part and the signal demodulation part.

20. The display apparatus of claim 15, wherein a circuit area of the signal modulation part is less than a circuit area of the signal demodulation part.

* * * * *

UNITED STATES PATENT AND TRADEMARK OFFICE
CERTIFICATE OF CORRECTION

| | | |
|---|---|---|
| PATENT NO. | : 8,289,314 B2 | Page 1 of 1 |
| APPLICATION NO. | : 12/569186 | |
| DATED | : October 16, 2012 | |
| INVENTOR(S) | : Weon-Jun Choe et al. | |

It is certified that error appears in the above-identified patent and that said Letters Patent is hereby corrected as shown below:

Title Page Item (30) Foreign Application Priority Data, insert
-- Mar. 20, 2009 (KR) ......10-2009-0023855 --; and In the Specification Column 1, line 8, after the word No. delete "2009-23855" and insert -- 10-2009-0023855 --.

Signed and Sealed this
Seventh Day of July, 2015

Michelle K. Lee
*Director of the United States Patent and Trademark Office*